US008672510B1

(12) United States Patent
Budelman

(10) Patent No.: US 8,672,510 B1
(45) Date of Patent: Mar. 18, 2014

(54) METHOD AND APPARATUS FOR DIAGNOSING AND REPAIRING FAULTS IN A SERIES-CONNECTED LAMP STRING

(71) Applicant: Gerald Allen Budelman, Olympia, WA (US)

(72) Inventor: Gerald Allen Budelman, Olympia, WA (US)

( * ) Notice: Subject to any disclaimer, the term of this patent is extended or adjusted under 35 U.S.C. 154(b) by 0 days.

(21) Appl. No.: 13/694,847

(22) Filed: Jan. 10, 2013

(51) Int. Cl.
 F21V 21/00 (2006.01)
(52) U.S. Cl.
 USPC ............... 362/249.16; 362/249.14; 439/822; 439/506; 315/185 R; 315/185 S
(58) Field of Classification Search
 USPC .......... 315/185 S, 185 R, 193, 312; 439/505, 439/506, 822; 362/227, 249.14, 249.16, 362/806; 324/414
 See application file for complete search history.

(56) References Cited

U.S. PATENT DOCUMENTS

| | | | |
|---|---|---|---|
| 3,725,780 A | 4/1973 | Olin | |
| 3,760,266 A | 9/1973 | Ocasio | |
| 4,625,174 A | 11/1986 | Eberhart | |
| 4,870,547 A * | 9/1989 | Crucefix | 362/123 |
| 5,008,626 A | 4/1991 | Boyd | |
| 5,047,721 A | 9/1991 | Farley | |
| 5,179,339 A | 1/1993 | Volk | |
| 5,319,312 A | 6/1994 | Segilia | |
| 5,369,363 A | 11/1994 | Hey | |
| 5,604,436 A | 2/1997 | Henritzy | |
| 5,854,541 A * | 12/1998 | Chou | 315/185 R |
| 6,074,244 A * | 6/2000 | Crum et al. | 439/505 |
| 6,285,140 B1 * | 9/2001 | Ruxton | 315/312 |
| 6,323,597 B1 | 11/2001 | Janning | |
| 6,480,001 B2 | 11/2002 | Frederick | |
| 6,518,707 B2 | 2/2003 | Gershen | |
| 6,556,018 B2 | 4/2003 | Benton | |
| 7,108,397 B2 * | 9/2006 | Wu | 362/249.05 |
| 7,166,968 B2 | 1/2007 | Janning | |
| 7,279,809 B2 | 10/2007 | Janning | |
| 7,554,266 B1 | 6/2009 | Chen | |
| 7,950,971 B2 * | 5/2011 | Hobet et al. | 439/822 |
| 8,314,564 B2 | 11/2012 | Yu | |
| 2012/0206146 A1 | 8/2012 | Avenel | |

* cited by examiner

Primary Examiner — Haiss Philogene

(57) ABSTRACT

A method and apparatus for detecting and repairing any number of faulty lamp assemblies in a substantially series-connected lamp string, typically used for holiday decoration. The apparatus comprises a pair of probes fashioned to temporarily penetrate the insulation of lamp connecting wire on either side of a number of lamps thus bridging such lamps either directly or via a current limiting means. The methods of use of such apparatus provide a minimal number of separate tests for determining the faulty lamp assemblies and/or providing a more intuitive method for special circumstances.

18 Claims, 4 Drawing Sheets

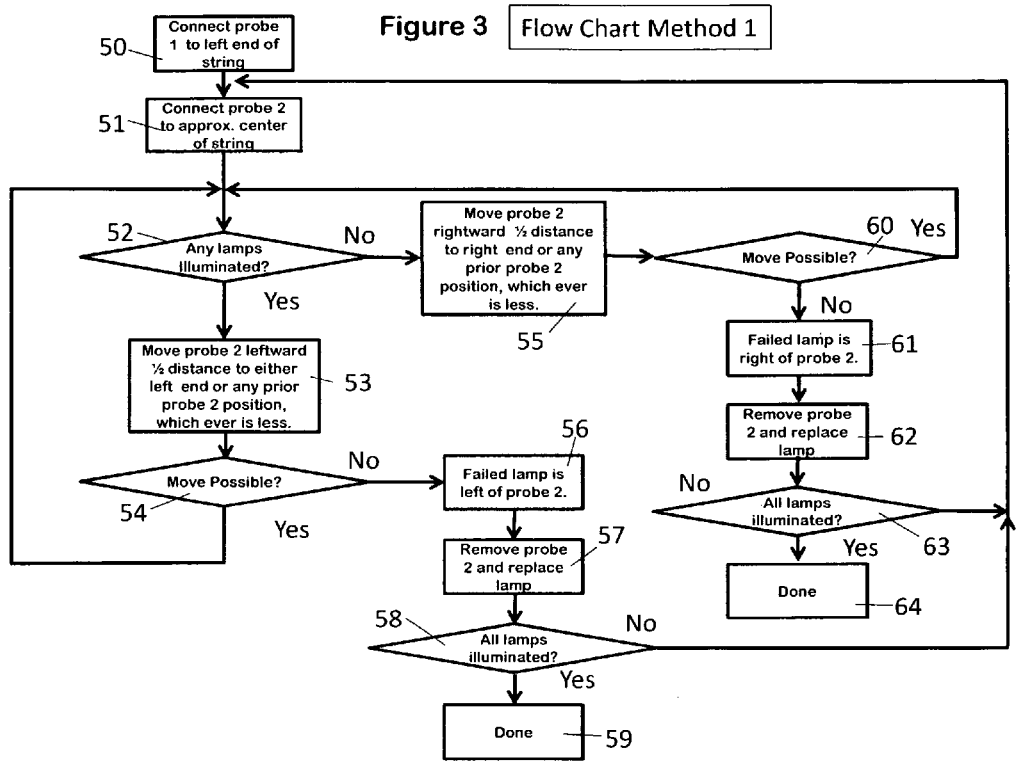

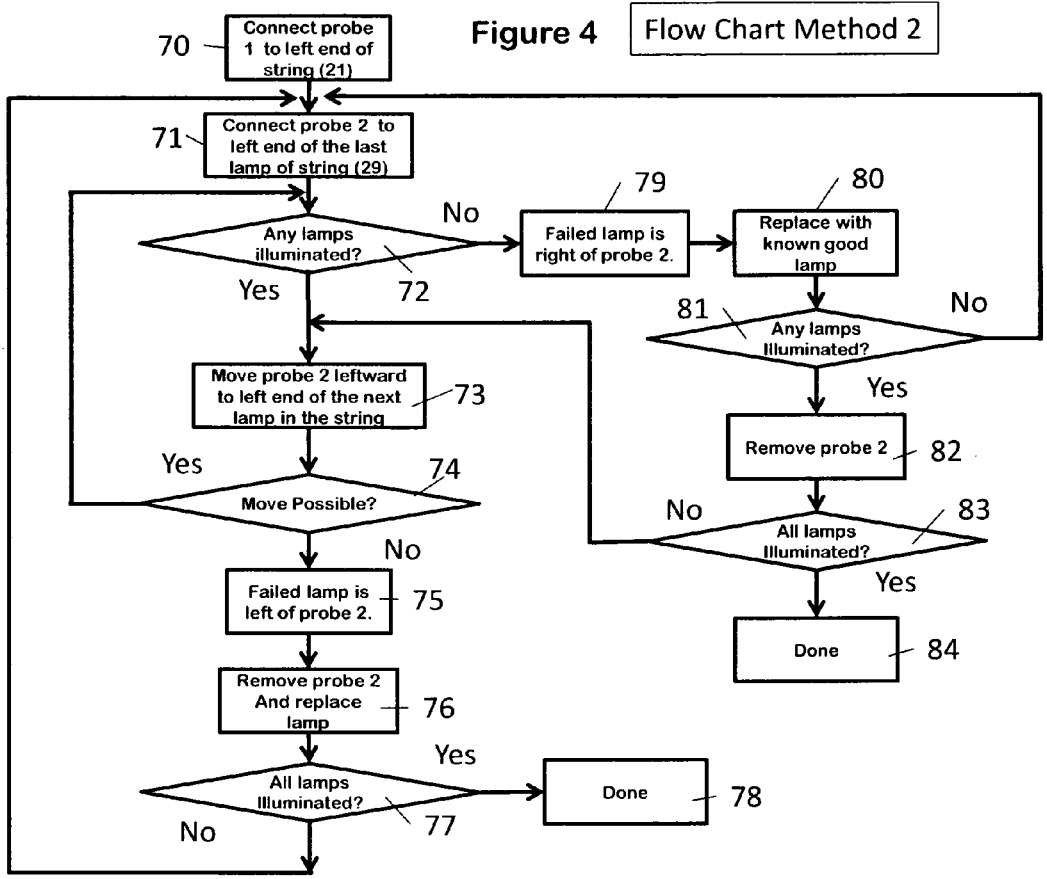

METHOD AND APPARATUS FOR DIAGNOSING AND REPAIRING FAULTS IN A SERIES-CONNECTED LAMP STRING

CROSS-REFERENCE TO RELATED APPLICATIONS

Not Applicable

FEDERALLY SPONSORED RESEARCH

Not Applicable

SEQUENCE LISTING OR PROGRAM

Not Applicable

BACKGROUND OF THE INVENTION

1. Field of Invention

This invention relates to tools and methods used to diagnose and repair faults in a grouping of series-connected lamps, typically used for decorative lighting during various holidays.

2. Prior Art

Strings of lights are widely used for decoration during major holidays such as Christmas, Halloween, the Fourth of July and others. The dominant configurations of these strings use a series-connected group of low voltage incandescent lamps or light emitting diodes (LED). The number of lamps in a string varies, but is typically 25-50 in order to match the line voltage in the United States and other countries.

Due to the series configuration, such strings have the unfortunate characteristic that a single lamp failure will cause all others to extinguish, thus making the task of fault diagnosis difficult. The conventional method for repairing such strings is to sequentially unplug each lamp, if indeed they are replaceable, and substitute a known good lamp in its place. For a 50 lamp string, this can require up to 50 separate operations. If more than one lamp has failed, this process can require over 1000 separate tests.

Many patents have attempted to address this problem. U.S. Pat. No. 3,725,780 (1973) to Olin shows a simple battery powered lamp tester which reduces the maximum number of tests to 50, even for multiple failures, but the approach fails to account for faults in the lamp socket or wiring. It further requires that the lamps be removable and is problematic for LED lamps due to polarity and reverse breakdown voltage issues. It further uses batteries which, if depleted, yield a false indication of a failure.

Incandescent lamps with various shunting devices have been proposed which activate in the event of an open filament. See U.S. Pat. No. 7,279,809 (2007), U.S. Pat. No. 7,166,968 (2007), U.S. Pat. No. 6,323,597 (2001) all to Janning. The most common commercial arrangement involves several turns of thinly-insulated wire wrapped around the support leads for the lamp filament. The wire is designed to short the lamp if voltage substantially greater than its design value is applied. Theoretically this happens if the filament opens and allows the remaining lamps to remain illuminated, thus highlighting the single failed lamp. In practice this arrangement is only partially effective and strings of such lamps experience frequent failures of the shunting mechanism. In addition to not being highly effective, any shunting device or structure adds to the cost of each and every lamp and/or socket in the string.

U.S. Pat. No. 6,480,001 (2002) to Frederick discloses a high voltage pulse device which, when attached to a faulty incandescent string, attempts to activate an otherwise inoperative shunt device. This scheme is only partially effective due to the variation in shunt characteristics, and is generally ineffective when more than one lamp is faulty. Moreover, this scheme is not effective with, and potentially injurious to, LED strings. Lamp failures not caused by a shunted open filament are not addressed.

U.S. Pat. No. 5,047,721 (1991) to Farley and U.S. Pat. No. 6,556,018 (2003) to Benton attempt to exploit the elevated electric field in the vicinity of an open filament lamp when its parent string is energized. The presence of such an increased field theoretically shows the location of the faulty lamp. This method again is only partly effective due to the variation in lamp configuration and operator diligence and is ineffective when more than one lamp has failed. Moreover, it does not work for LED strings which use direct current.

Various probing methods have been proposed which require lamps to be removed e.g. U.S. Pat. No. 5,319,312 (1994) to Segilia, or which use external batteries and pins to contact the internals of a lamp socket e.g. U.S. Pat. No. 5,179,339 (1993) to Volk. The socket probing method fails where the connecting wires are molded into the socket base, thus preventing the connection to lamp socket internal contacts. Both approaches fail to address LED strings; in Segilia due to the lamp's high resistance under low applied voltages and in Volk, due to potentially injurious high reverse voltage if connected incorrectly. Furthermore, removing the lamps for testing (Segilia) often introduces additional failures thus extending the process and frustrating the user.

U.S. Pat. No. 5,604,436 (1997) to Henritzy et al. displays a probe apparatus that is powered from the 110 volt mains, but features an energized probe member which can be inadvertently touched by the operator despite its nominal guarding structure. It also requires that the internal contacts of the socket be accessible from the bottom, and is thus inoperative if wires are molded into socket bases.

US patent application US2012/0206146 (2012) to Avenel shows a method to indicate that at least one LED in a series-connected string is faulty, but fails to find which one is defective and requires a detailed measurement of voltages at different points along the string. Such measurements involve expensive, technical equipment far beyond the abilities and budgets of most consumers and are very difficult to conduct on typical holiday lamp strings.

OBJECTS AND ADVANTAGES

Accordingly, besides the objects and advantages of the apparatus and method described in my above patent, several objects and advantages of the present invention are:

(a) to provide a method and apparatus, hereafter referred to as a tool, for rapidly and accurately diagnosing failed lamp and/or lamp assemblies in a substantially series-connected string of incandescent or LED lamps.

(b) to provide such a tool that is independent of the specific configuration, construction or arrangement of the lamp's socket.

(c) to provide such a tool that eliminates the need for batteries to operate.

(d) to provide such a tool which eliminates the need for repeated removal and insertion of lamps, which process promotes further failures.

(e) to provide such a tool that eliminates exposure of the user to potential high voltages from energized probes.

(f) to provide such a tool which functions for lamp sockets whose wires are molded into the base and otherwise not accessible.
(g) to provide such a tool which functions when lamps are not removable.
(h) to provide such a tool of minimum cost structure due to utilization of the lamp string under test as the indicating mechanism.
(i) to provide such a tool which operates using a method that minimizes the number of separate tests in order to locate all failed lamps or lamp assemblies.
(j) to provide such a tool that eliminates the concern for polarity of LED lamps or probe interchangeability.
(k) to provide a tool and method suitable for diagnosing strings with a large number of simultaneous failed lamp assemblies.
(l) to provide such a tool that allows for the efficient diagnosis of parallel connected lamps within a series string.

Still further objects and advantages will become apparent from a consideration of the ensuing description and drawings.

SUMMARY OF INVENTION

In accordance with the present invention, a method and apparatus for bridging a user-defined number of substantially series-connected lamps for the purpose of diagnosing lamp assembly faults, comprising a first means for aligning and retaining a first section of insulated wire and connecting to said first section via penetrative means, and a second means for accomplishing the same on a second section of insulated wire, each penetrative means being connected either directly or via a current limiting and/or protective means.

DRAWINGS

Figures

In the drawings, closely related elements exhibit the same number but different alphabetic suffixes.

FIG. 3 is a flow diagram for a first method of using the apparatus resulting in a minimal number of separate tests to achieve results.

FIG. 4 is a flow diagram for a second method of using the apparatus resulting in a more intuitive process for novice users or for special circumstances.

DRAWINGS

Reference Numerals

Figure 1:
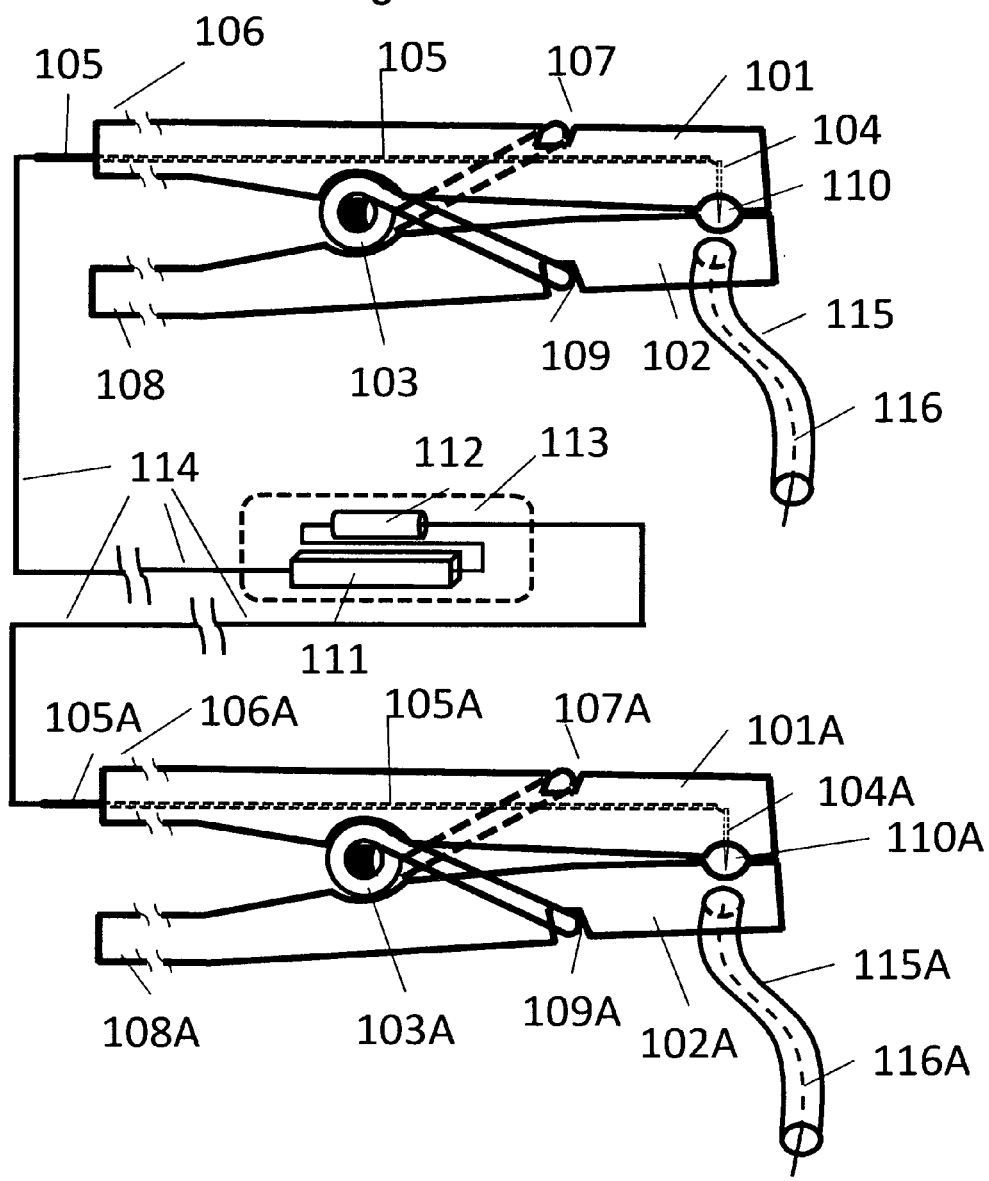
FIG. 1 shows substantially a side view of a preferred embodiment of the complete apparatus inclusive of optional elements.
Figure 2:
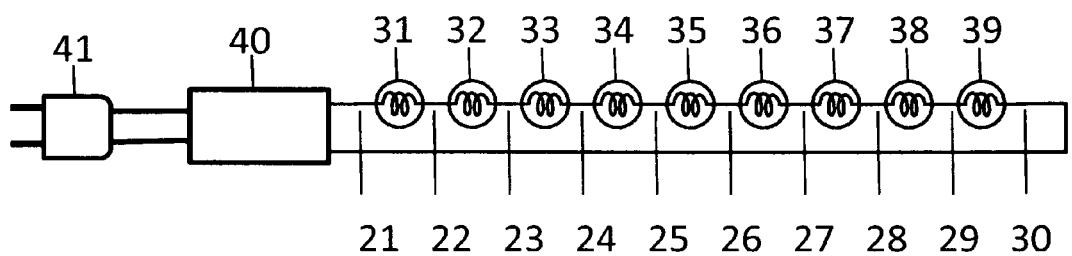
FIG. 2 is a schematic diagram of a typical, although abbreviated series-connected lamp string, showing several lamp elements and potential connection points.
Figure 5:
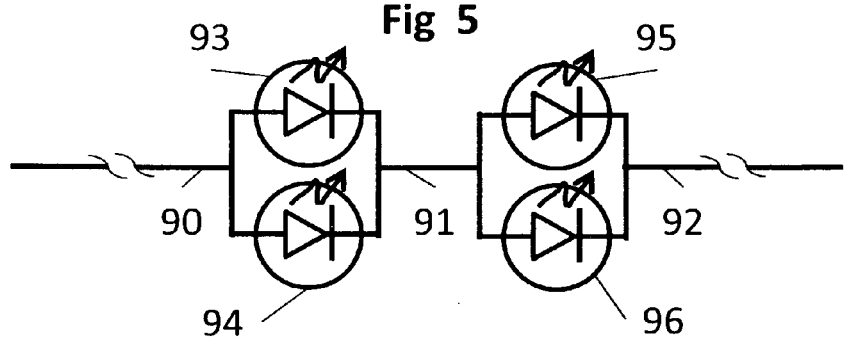
FIG. 5 is a partial schematic of a portion of a series-parallel LED lamp string structure commonly in use.

FIG. 1
101 first upper clip housing
101A second upper clip housing
102 first lower clip housing
102A second lower clip housing
103 first pre-tensioned spring
103A second pre-tensioned spring
104 first insulation-penetrating needle
104A second insulation-penetrating needle
105 first needle connecting wire
105A second needle connecting wire
106 first upper finger pressure area
106A second upper finger pressure area
107 first upper spring retention recess
107A second upper spring retention recess
108 first lower finger pressure area
108A second lower finger pressure area
109 first lower spring retention recess
109A second lower spring retention recess
110 first lamp wire retention area
110A second lamp wire retention area
111 current limiting resistor
112 thermal cutoff
113 electrical component housing
114 insulated wire
115 first lamp wire section
115A second lamp wire section
116 first lamp wire section inner conductor
116A second lamp wire section inner conductor
FIG. 2
21 left most connection point
22 left terminal of lamp assembly 2
23 left terminal of lamp assembly 3
24 left terminal of lamp assembly 4
25 left terminal of lamp assembly 5
26 left terminal of lamp assembly 6
27 left terminal of lamp assembly 7
28 left terminal of lamp assembly 8
29 left terminal of rightmost lamp assembly 9
30 right most connection point
31 leftmost lamp assembly 1
32 lamp assembly 2
33 lamp assembly 3
34 lamp assembly 4
35 lamp assembly 5
36 lamp assembly 6
37 lamp assembly 7
38 lamp assembly 8
39 rightmost lamp assembly 9
40 rectification circuit for LED strings
41 Line plug for power mains
FIG. 3
50-64 Various steps in method 1 process flow
FIG. 4
70-84 Various steps in method 2 process flow
FIG. 5
90 Leftward connection point
91 Center connection point
92 Rightward connection point
93 Upper LED, pair 1
94 Lower LED pair 1
95 Upper LED pair 2
96 Lower LED pair 2

DETAILED DESCRIPTION

FIG. 1 Preferred Embodiment

A preferred embodiment of the present invention is illustrated in FIG. 1. Reference numbers 101,102, 103, 106, 107, 108, and 109 show a clothespin-like structure which can be opened against torque from pre-tensioned spring 103, by applying finger pressure on upper finger pressure area 106 and lower finger pressure area 108. Spring 103 is captured by its opposite ends being fit into the lower spring retention recess 109 and the upper spring retention recess 107. Spring 103 thus forms a pivot point for the upper and lower clip housings 101 and 102. The material comprising upper and lower housings 101 and 102 can be any easily molded insulating substance such as polystyrene. A sharpened metal insulation-penetrating needle 104 is inserted or molded into upper housing 101 in a manner whereby the point of needle 104 extends to nearly the bottom of lamp wire retention area 110. Lamp wire retention area 110 serves as an alignment and retention means for insulated wire typically used in the construction of series-connected lamp strings. Area 110 comprises a substantially semicircular groove in upper clip housing 101 and an adjacent such groove in lower clip housing 102. The diameter of the resulting, substantially circular area should be closely matched to the typical outer diameter of insulated lamp string connecting wire. A typical value for such wire outside diameter is 2.34 mm (0.092 inches). In this manner, lamp wire section 115 is held in a fixed and repeatable position relative to needle 104. Thus, numbers 101, 102, 103, 106, 107, 108 and 109 comprise a means for aligning and retaining a section of insulated lamp string connecting wire 115, while numbers 104 and 105 comprise an electrically-conducting insulation-penetrating means.

Needle 104 is arranged to penetrate connecting wire 115 and to establish electrical contact with its inner conductor 116. Needle 104 is further electrically connected to needle connecting wire 105 which emerges from upper clip housing 101 in the vicinity of upper finger pressure area 106. The needle connecting wire 105 is insulated along its entire length.

The structure described above is virtually duplicated as a second clothespin-like structure and can be seen in FIG. 1 as numbers 101A through 110A, 115A and 116A. The two clothespin-like structures are connected via insulated wire 114 in a manner whereby insulation-penetrating needle 104 is electrically connected to insulation-penetrating needle 104A with or without optional electrical components 111 and 112 in series with wire 114.

In use, the first clothespin-like structure, hereafter referred to as probe 1, is grasped by the fingers and lamp retention area 110 is separated allowing an insulated wire from a series-connected lamp string section 115 to be inserted into area 110. When pressure on areas 106 and 108 is released, spring 103 forces upper clip housing 101 and lower clip housing 102 to converge, aligning and retaining a section of insulated wire 115 and forcing needle 104 into and through the wire insulation and making electrical contact with the wire inner conductor 116.

The second clothespin-like structure, hereafter referred to as probe 2, is similarly affixed to a second section of wire 115A from the same series-connected lamp string, effectively bridging all lamps, sockets and wires between the attachment points. As an example, referring to FIG. 2, probe 1 could be connected to position 23, and probe 2 connected to position 26, thus bridging lamp assemblies number 33, 34 and 35. If lamp assemblies 33, 34 or 35 have failed, a portion of the series-connected lamp string will then illuminate, indicating that the fault is located between the position of probe 1 and probe 2. Note that the first and second clothespin-like structures are operationally interchangeable.

In the preferred embodiment, current limiting resistor 111 has characteristics chosen to be appropriate for use with either incandescent, LED or other type of lamp. Two considerations are the resistance value and the wattage rating of the resistor. The resistance value must allow for two extreme conditions: a) a single lamp is bridged and the current flow must be sufficient for the remainder of the lamp string to exhibit sufficient illumination to be easily discerned by the user, and b) all but one lamp is bridged and the resulting current must not damage the single lamp, nor result in an unsafe condition. The wattage value must be sufficient so that when a maximal number of lamps are bypassed, the resulting power dissipation will not result in a hazardous condition.

In the case of typical miniature incandescent lamps, a resistor of 1,000 ohms is suitable. Maximum power dissipation would be about 12 watts for a 110 volt power system such as found in the United States. A resistor of about 10 watts is appropriate for the short duration that the probes would be connected. For a string of LED lamps, an appropriate resistor value is about 5,000 ohms with a maximum power dissipation value of about 3 watts. For other types of lamps, substantially different values may be required.

While the nominal power dissipation during typical use should be modest, if the user mistakenly leaves the probes connected for an extended period while bridging a large number of lamps, the resistor may heat to the point of creating a burn or fire risk. Additionally, the resistor may be sized smaller in power dissipation for cost reduction or cosmetic reasons and as such the burn or fire risk is elevated. To eliminate this risk, a thermal cutoff device 112 is connected in series with resistor 111 and arranged to sense its temperature. An example of such a device is an EYP-2BN099 thermal cutoff, manufactured by Panasonic. If the temperature exceeds a predetermined level, for example 100 degrees Celsius, the disconnect opens and allows the resistor to cool. This disconnect may be either a one-time device, as referenced above which opens permanently, or a self-resetting device which cycles on and off until the probes are disconnected or power to the lamp string is removed. The one-time device is preferred for maximum safety. The thermal cutoff would be tightly coupled to the resistor within an electrical component housing 113 to shield the user from high temperatures and voltages and to ensure that the two components work together.

Alternate Embodiments

While a presently preferred embodiment has been described, it should be clear to anyone ordinarily skilled in the art, that other means can be employed for the various elements and still remain within the scope of the present invention.

For example, the structure used to grasp and align the lamp string connecting wire can be any means which performs this function and allows an insulation penetration means to effect an electrical connection with the wire. For example, the structure need not be finger operated, can use a different configuration of spring, or not require a spring, nor necessarily be molded. One structure may be normally held closed by spring pressure, and the other be held open by spring pressure thus requiring the user to maintain electrical connection via finger pressure. This would prevent the connection from being maintained for an inordinate period of time.

The insulation-penetrating needle may consist of multiple needles to increase reliability, or it may pierce the wire's insulation using a tapered slot in a thin metal sheet. The lamp wire retention area 110 can assume various geometries such as a V-groove.

The preferred embodiment recites a resistor 111 as a current limiting means, but other options exist such as no current limiter, or a more complex circuit which establishes a substantially constant current regardless of the number of lamps bypassed. In the latter case, the power dissipation of the current limiting means can be substantially reduced at the expense of complexity.

Thermal cutoff 112 could be combined with resistor 111 in the form of a fusible resistor.

Resistor 111 and thermal cutoff 112 or logical equivalents, may be located anywhere along wire 114 or contained within one of the clothespin-like structures which would then serve as electrical component housing 113.

Throughout this document, the term lamp is used to mean any type of relatively low voltage illuminative source. Two examples include miniature incandescent bulbs and LEDs of various colors and types. The present invention can also apply to other sources of light. Although series-connected lamp strings are commonly used for holiday decorations, the present invention can be seen to apply to any series-connected illuminative system.

DETAILED DESCRIPTION

Method of Operation. FIGS. 2, 3, & 4

There are several ways to use the previously described device to rapidly and accurately locate faults in a series-connected lamp string. The first method is illustrated via the flow chart in FIG. 3. This method uses a binary search algorithm to locate the fault, or faults in a minimal number of test steps. The second method is illustrated via the flow chart in FIG. 4 and may be suitable for novices or in situations where the position of the various lamps along the string is unclear. It is possible and sometimes advantageous to combine the two methods, using method 1 to first narrow the area of search, and then method 2 to home in on the exact fault.

In FIG. 2, numbers 31 through 39 illustrate 9 lamp assemblies which are part of a series-connected lamp string. Although typical strings contain 25 to 50 lamps, the number of lamp assemblies in FIG. 2 is abbreviated for clarity. While the electrical symbol shown designates an incandescent lamp, it will be understood that any relatively low voltage illuminative source can be substituted and the concept will remain valid.

Method 1

Unless otherwise noted, all numbers refer to FIG. 3.

Once it has been determined that an energized series-connected lamp string, hereafter referred to as a string, does not illuminate, method 1 begins by selecting one probe, hereafter referred to as probe 1, and affixing it to the leftmost end of the string (step 50). This corresponds to position 21 in FIG. 2. This is the point where either alternating current in the case of incandescent lamps or direct current in the case of LED lamps is first applied to the series string. The flow chart of FIG. 3 refers to the left end of the string simply for clarity in describing the process, but all such terms as left, leftmost, leftward etc. can be replaced with right, rightmost, rightward, (and vice versa) and the process remains valid.

The second probe, hereafter referred to as probe 2, is then connected to a position approximately at the center of the string, which is where about ½ of the lamps are on either side of the connection point for probe 2 (step 51). This corresponds to either position 25 or 26 in FIG. 2 since an odd number of lamp assemblies are shown. If some portion of the string illuminates (step 52), it is known that the fault or faults do not lie rightward of the probe 2 position, and thus probe 2 is now moved leftward ½ of the remaining distance to the leftmost connection point, or if probe 2 has been previously placed left of the current position, then it is moved about ½ of the distance to that prior position, whichever is a lesser distance (step 53). This, for example, would correspond to position 23 or 24 on FIG. 2. If the probe is not able to be moved two lamp positions without either contacting or overshooting the leftmost connection point (position 21 on FIG. 2) or a previous probe 2 connection point, then the move is considered impossible. This choice is shown at step 54.

If the move is possible, then the process continues at step 52. If it is not possible, the failed lamp is located at the lamp position immediately to the left of the current position of probe 2 (step 56). For example, if probe 2 were at position 22 in FIG. 2, and some lamps are illuminated, then lamp assembly 31 is faulty. Probe 2 is disconnected and the lamp is replaced with a known operative lamp (step 57). The user then observes if the entire string illuminates (step 58). If so, the task is complete (step 59). If not, then additional faults are present or may have been introduced during the search, and the process begins anew by returning to step 51. Note that probe 1 remains connected to the extreme left end of the string.

Referring to step 54, if the move is possible, the user observes the string (step 52) and if no lamps are illuminated, probe 2 is moved rightward ½ of the distance toward the rightmost connection point, or if probe 2 has been previously placed right of the current position, ½ of the distance to that prior position, whichever is a lesser distance (step 55). If probe 2 is not able to be moved two lamp positions without contacting or overshooting the rightmost connection point of the string (position 30 on FIG. 2) or a previous probe 2 connection point, then the move is considered impossible. This choice is shown at step 60.

If the move is possible, then the process continues at step 52. If it is not possible, the failed lamp is located at the lamp position immediately to the right of the current position of probe 2 (step 61). Probe 2 is disconnected and the lamp is replaced with a known operative lamp (step 62). The user then observes if the entire string illuminates (step 63). If so, the task is complete (step 64). If not, then additional faults are present or may have been introduced during the search, and the process begins anew by returning to step 51. Note that probe 1 remains connected to the extreme left end of the string.

Consider an example where lamp assembly 8, e.g. 38 on FIG. 2, is faulty. Probe 2 is first connected to position 25 which results in no illumination. Probe 2 is then moved ½ the distance toward position 30 which could be position 27 or 28. Selecting position 28, there is still no illumination. Probe 2 is then moved one lamp position rightward to position 29 and the last lamp assembly illuminates. This indicates that lamp assembly 38 is faulty. After replacement, all lamps illuminate and thus the process completes in 3 test steps.

Whenever the process repeats by returning to step 51, all notions of prior probe 2 position are vacated.

Method 1 ensures that the location of a single fault within a typical string of 30-50 lamps can be found with no more than about 6 separate tests. Moreover, the location of two simultaneous faults will require no more than about 12 separate tests. This is in stark contrast to the conventional "remove and replace" method which requires up to 50 tests for a single fault and over 1000 tests for a double fault. Methods which allow for the individual testing of each lamp, still require up to 50 tests to find a single fault, thus it can be seen that method 1 in conjunction with the apparatus of the present invention provides a far superior solution for identifying faults in a series-connected string of lamps.

Method 2

While method 1 affords a minimal number of tests to locate a fault, an alternate method may be employed which is somewhat more intuitive and may be preferred when the positions of the various lamps along the string may be obscured. Also, if a large number of simultaneous faults are suspected, method 2 may yield faster results. Unless otherwise noted, all numbers refer to FIG. 4.

Once it has been determined that a series-connected lamp string, hereafter referred to as a string, does not illuminate, method 2 begins by selecting one probe, hereafter referred to as probe 1, and affixing it to leftmost connection point 21 in FIG. 2, of the string (Step 70). The flow chart of FIG. 4 refers to the leftmost connection point of the string simply for clarity in describing the process, but all such terms as left, leftward etc. can be replaced with right, rightward, one extreme end, the other extreme end etc. and the process remains valid.

The second probe, hereafter referred to as probe 2, is connected to the left terminal of the rightmost lamp assembly in the string; position 29 in FIG. 2. This step is shown as number 71 on FIG. 4. If any lamp illuminates (step 72), then probe 2 is moved leftward one lamp position (step 73). If the move is possible, then the process returns to step 72. The move is considered impossible if probe 2 would connect the leftmost connection point of the string; position 21 on FIG. 2.

If the move is impossible, then the fault lies to the immediate left of the current probe 2 position (step 75). Probe 2 is disconnected and the faulty lamp replaced with a known good lamp (step 76). If all lamps now illuminate (step 77), the process successfully terminates (step 78). If all lamps do not illuminate, then there are additional faults, and/or previously unknown faults were introduced and the process returns to step 71. Note that probe 1 remains connected to the extreme left end of the string.

If the move (step 74) is possible, then the process returns to step 72 to check for illumination. If no lamps are illuminated, a fault is located immediately to the right of the current position of probe 2 (step 79). The faulty lamp is removed and replaced with a known good lamp (step 80). If any lamps illuminate (step 81); probe 2 is removed (step 82) and the string observed to see if all lamps are illuminated (step 83). If so, the process successfully terminates at step 84. If all lamps do not illuminate, the process returns to step 73 to look for additional faults.

Referring to FIG. 2, consider an example wherein lamp assembly 31 is faulty. Probe 1 is connected to position 21 and probe 2 connected to position 29. The string partially illuminates, so probe 2 is successively moved to positions 28, 27, 26, 25, 24, and 23, and 22, in turn including lamp assemblies 38, 37, 36, 35, 34, 33 and 32 in the test, each time observing that some illumination results. Since a move to position 21 is considered impossible, the fault lies at lamp assembly 31, immediately to the left of the current probe 2 position. Probe 2 is disconnected and this lamp is replaced with a known good unit and the string is seen to completely illuminate, thus completing the process.

Additional Methods

The general concept of bridging a subset of the lamps in a string can be applied in several other ways. For example, the two probes noted above can be used to bridge a few lamps at a time, such as 10. Limiting the number of lamps being bridged reduces the power dissipation in the current limiting means and permits a less expensive resistor, or even the elimination of the resistor and/or thermal cutoff mechanism. In such a situation, the probes would be leapfrogged down the lamp string, each time only bridging a limited number of lamp assemblies. If any of the lamps illuminate during a given bridging operation, at least one faulty lamp assembly lies between the two connection points. The process described in method 2 can then be used to home in on the faulty lamp assembly by progressively bridging fewer lamp assemblies. The number of lamps bridged for a given test should be limited to ensure that the electrical stress placed on the remaining lamps does not cause a failure.

Method of Operation—Additional Considerations

LED lamp strings provide a circuit for rectifying the alternating current of the 110 volt electric mains to provide the direct current that LEDs require and the circuit also provides a current limiting feature. In FIG. 2, number 40 depicts such a circuit and 41 shows a line plug. Additionally, some implementations of such rectification include a voltage doubling circuit thus allowing more series-connected LEDs for a given line voltage. In such cases, position 21 in FIG. 2 may represent the positive terminal, or position 30 in FIG. 2 may represent the positive terminal and the voltage between the two may vary significantly. Regarding the present invention, the polarity and voltage levels are irrelevant for proper operation, and the tool probes are seen to be interchangeable.

Some strings of LED lamps use a series-parallel configuration, a portion of which is shown in FIG. 5. Two sets of two LED lamps are connected in parallel (LEDs 93/94 and 95/96) and each such pair of lamps connected in series. In a typical such string, up to 50 paralleled pairs are series-connected, and for the purposes of the methods described above, each lamp is considered to be the pair of parallel connected LEDs. Connection points such as those labeled position 24, 25 and 26 on FIG. 2 are analogously shown on FIG. 5 as positions 90, 91 and 92. If a fault is found in such a pair of parallel connected LEDs, both individual LEDs or their respective lamp assemblies may be faulty.

In a series-connected lamp string, faults can result from failed lamps, but also can result from bad sockets or even failed or damaged sections of wire. It will be understood by anyone ordinarily skilled in the art that if the above methods locate an area of fault, and replacement of the lamp does not result in success, the socket or wiring may be at fault. The present invention, unlike prior art, can identify such failures. I refer to the combination of lamp, socket and immediately associated wiring as a lamp assembly. In most cases, replacing a faulty lamp assembly means replacement of the lamp which is fitted into the lamp socket. However, if the lamps are not replaceable, then using the methods and apparatus previously described will identify which assembly is faulty and the entire assembly can be replaced or bypassed.

CONCLUSIONS, RAMIFICATIONS AND SCOPE

Accordingly the reader will see that the apparatus and method of this invention can be used to rapidly diagnose and repair faults in a substantially series-connected string of lamps regardless of the socket configuration, type of illuminative element, polarity of illuminative element, and presence or absence of replaceable lamps in such strings. Moreover, the apparatus requires no access to hidden terminals in a socket base, shields the user from exposure to line voltages, avoids the use of batteries and does not require functional lamps to be removed from their sockets as part of the diagnosis process thus potentially causing additional failures. The cost of the apparatus can be very low due to the novel use of an electrically-conductive, insulation-penetrating structure and inexpensive electrical components. The methods taught for diagnosis and repair ensure a minimal number of tests to ascertain the faulty lamp assembly or assemblies; far fewer than traditional methods, especially when multiple faults are simultaneously present.

Although the description above includes much specificity, this should not be viewed as limiting the scope of the invention, but as merely providing illustrations of some of the presently preferred embodiments of this invention. Thus the scope of the invention should be determined by the appended claims and their legal equivalents, rather than by the examples given.

I claim:

1. An apparatus for electrically bridging a user-selected number of lamp assemblies in a substantially series-connected lamp assembly string comprising
    (a) a first means for aligning and retaining a first section of insulated wire, said first means containing a first electrically-conductive insulation-penetrating means which connects to the inner conductor of said first section of insulated wire,
    (b) a second means for aligning and retaining a second section of insulated wire, said second means containing a second electrically-conductive insulation-penetrating means which is connected to the inner conductor of said second section of insulated wire,
    (c) said first electrically-conductive insulation-penetrating means communicating with said second electrically-conductive insulation-penetrating means,
    (d) whereby a user can quickly diagnose and repair faults in said substantially series-connected lamp assembly string.

2. The apparatus of claim 1 further comprising a current limiting means being placed in electrical series connection between said first electrically-conductive insulation-penetrating means, and said second electrically-conductive insulation-penetrating means.

3. The apparatus of claim 2 wherein said current limiting means is a resistor.

4. The apparatus of claim 2 further comprising a thermally-activated current interrupting means being placed electrically in series with said current limiting means and is arranged to activate when the temperature of said current limiting means becomes excessive.

5. The apparatus of claim 3 further comprising a thermally-activated current interrupting means being placed electrically in series with said resistor and is arranged to activate when the temperature of said resistor becomes excessive.

6. The apparatus of claim 4 wherein said thermally-activated current interrupting means is a thermal cutoff device.

7. The apparatus of claim 5 wherein said thermally-activated current interrupting means is a thermal cutoff device.

8. The apparatus of claim 1 wherein said first electrically-conductive insulation-penetrating means comprises a first structure of one or more sharp metallic points and said second electrically-conductive insulation-penetrating means comprises a second structure of one or more sharp metallic points.

9. The apparatus of claim 8 further comprising a current limiting means being placed in electrical series connection between said first structure of one or more sharp metallic points and said second structure of one or more sharp metallic points.

10. The apparatus of claim 9 wherein said current limiting means is a resistor.

11. The apparatus of claim 9 further comprising a thermally-activated current interrupting means being placed electrically in series with said current limiting means and is arranged to activate when the temperature of said current limiting means becomes excessive.

12. The apparatus of claim 10 further comprising a thermally-activated current interrupting means being placed electrically in series with said resistor and is arranged to activate when the temperature of said resistor becomes excessive.

13. The apparatus of claim 11 wherein said thermally-activated current interrupting means is a thermal cutoff device.

14. The apparatus of claim 12 wherein said thermally-activated current interrupting means is a thermal cutoff device.

15. The apparatus of claim 2 wherein said current limiting means comprises a fusible resistor.

16. The apparatus of claim 9 wherein said current limiting means comprises a fusible resistor.

17. A first method for determining which lamp assemblies in an energized substantially series-connected lamp assembly string, hereafter referred to as a lamp string, are faulty by
    a. attaching a first electrically-conductive insulation-penetrating means, hereafter referred to as probe 1, to the left-most wire of said lamp string, then
    b. attaching a second electrically-conductive insulation-penetrating means, hereafter referred to as probe 2, to the approximate center of said lamp string, said probe 1 and said probe 2 being electrically communicative and
    c. observing if any part of said lamp string illuminates, in which case said probe 2 is moved leftward approximately one half the number of lamps between the current connection point of said probe 2 and the extreme left end of said lamp string, or any prior connection position of said probe 2, whichever is fewer and
    d. noting if such movement is not possible, a faulty lamp assembly lies immediately to the left of the current connection point of said probe 2 in which case said probe 2 is disconnected and the faulty lamp assembly replaced with a known good lamp assembly whereupon If all lamps in said lamp string now illuminate, the process is complete, otherwise If all lamps in said lamp string do not illuminate, going to step b, but If movement is possible, then going to c,
    e. noting however if in c, no lamps in said lamp string illuminate, then said probe 2 is moved rightward approximately one half the number of lamp assemblies between the current connection point of said probe 2 and the rightmost connection point of said lamp string, or any prior connection position of said probe 2, whichever is fewer,
    f. observing if such a move is not possible, the faulty lamp assembly lies immediately to the right of the current connection point of said probe 2 whereupon said probe 2 is disconnected and the faulty lamp assembly replaced with a known good lamp assembly and if this action results in all lamps in said lamp string illuminating, the process is complete, otherwise, going to b, although If movement is possible, then going to c.

18. A second method for determining which lamp assemblies in an energized substantially series-connected lamp assembly string, hereafter referred to as a lamp string, are faulty by
    a. attaching a first electrically-conductive insulation-penetrating means, hereafter referred to as probe 1, to the left-most wire of said lamp string, then
    b. attaching a second electrically-conductive insulation-penetrating means, hereafter referred to as probe 2, to the left terminal of the rightmost lamp assembly of said lamp string, said probe 1 and said probe 2 being electrically communicative and
    c. observing if any part of said lamp string illuminates, in which case
    d. moving said probe 2 leftward one lamp position without connecting to the leftmost wire of said lamp string and returning to c, unless such a move is not possible, in which case a faulty lamp assembly is located immediately to the left of the current connection position of said probe 2 and said probe 2 is disconnected and the faulty lamp assembly is replaced with a known good lamp assembly which If all lamps in said lamp string illuminate, the process is complete, otherwise going to b, e. observing however in c, if no lamps are illuminated, the faulty lamp assembly lies immediately to the right of the current connection point of said probe 2 and the faulty lamp assembly is replaced with a known good lamp assembly whereupon If any lamps in said lamp string illuminate, said probe 2 is disconnected and if all lamps in said lamp string are illuminated, the process is complete, otherwise going to d.

* * * * *